(12) United States Patent
Takiguchi

(10) Patent No.: US 9,909,205 B2
(45) Date of Patent: Mar. 6, 2018

(54) VAPOR DEPOSITION APPARATUS, VAPOR DEPOSITION METHOD USING VAPOR DEPOSITION APPARATUS, AND DEVICE PRODUCTION METHOD

(71) Applicant: JOLED INC., Tokyo (JP)

(72) Inventor: Akira Takiguchi, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/124,145

(22) PCT Filed: Feb. 24, 2015

(86) PCT No.: PCT/JP2015/000902
§ 371 (c)(1),
(2) Date: Sep. 7, 2016

(87) PCT Pub. No.: WO2015/136859
PCT Pub. Date: Sep. 17, 2015

(65) Prior Publication Data
US 2017/0051394 A1  Feb. 23, 2017

(30) Foreign Application Priority Data
Mar. 11, 2014  (JP) .................. 2014-048025

(51) Int. Cl.
*H01L 29/18* (2006.01)
*H01L 51/05* (2006.01)
(Continued)

(52) U.S. Cl.
CPC .......... *C23C 14/243* (2013.01); *C23C 14/542* (2013.01); *C23C 14/564* (2013.01);
(Continued)

(58) Field of Classification Search
CPC .......... H01L 51/05; H01L 51/00; H01L 29/06
(Continued)

(56) References Cited

U.S. PATENT DOCUMENTS 4,608,063 A * 8/1986 Kurokawa .......... C23C 16/4412
118/50.1
4,886,444 A * 12/1989 Hirase .................... F23G 7/06
110/213
(Continued)

FOREIGN PATENT DOCUMENTS

CN     102102175      6/2011
CN     102732839      10/2012
(Continued)

OTHER PUBLICATIONS

JP2004-059982,Nishimori, Taisuke, Machine Translation in English.*
(Continued)

*Primary Examiner* — Sheikh Maruf
(74) *Attorney, Agent, or Firm* — Greenblum & Bernstein, P.L.C.

(57) ABSTRACT

A vapor deposition apparatus including: a chamber that holds an object on which a film is to be deposited through vapor deposition; a vapor deposition source that is disposed inside the chamber, the vapor deposition source having a housing that accommodates therein a vapor deposition material for the vapor deposition; and a heater that heats the vapor deposition material. The housing has a plurality of eject outlets and an air outlet that is openable and closable, the plurality of eject outlets connecting the inside of the housing with the outside of the housing and ejecting vapor of the vapor deposition material towards the object.

6 Claims, 12 Drawing Sheets

(51) Int. Cl.
  *H01L 29/08* (2006.01)
  *C23C 14/24* (2006.01)
  *H05B 33/10* (2006.01)
  *C23C 14/56* (2006.01)
  *C23C 14/54* (2006.01)
  *H01L 51/56* (2006.01)
  *H01L 51/00* (2006.01)

(52) U.S. Cl.
  CPC .......... *H01L 51/0508* (2013.01); *H01L 51/56* (2013.01); *H05B 33/10* (2013.01); *H01L 51/001* (2013.01)

(58) Field of Classification Search
  USPC .... 438/46, 462; 257/90, 96, 88, 40, E21.09, 257/E21.269
  See application file for complete search history.

(56) References Cited

U.S. PATENT DOCUMENTS

| | | | | |
|---|---|---|---|---|
| 5,334,250 | A * | 8/1994 | Mikami | C23C 16/455 118/715 |
| 5,407,487 | A * | 4/1995 | Weber | C23C 16/01 118/728 |
| 5,670,997 | A * | 9/1997 | Sugimoto | B41J 2/16508 347/30 |
| 6,237,529 | B1 * | 5/2001 | Spahn | C23C 14/243 118/723 VE |
| 6,875,282 | B2 | 4/2005 | Tanaka | G03F 1/66 118/719 |
| 2009/0039772 | A1 * | 2/2009 | Takashima | H01J 37/32541 313/504 |
| 2009/0041929 | A1 | 2/2009 | Ohmi et al. | |
| 2009/0074952 | A1 * | 3/2009 | Yamazaki | C23C 14/12 427/70 |
| 2010/0081256 | A1 * | 4/2010 | Uemura | H01L 33/0079 438/462 |
| 2010/0173067 | A1 | 7/2010 | Ukigaya et al. | |
| 2010/0259162 | A1 | 10/2010 | Moyama | |
| 2010/0328889 | A1 * | 12/2010 | Campbell | H05K 7/20809 361/700 |
| 2011/0000430 | A1 * | 1/2011 | Yanagi | C23C 14/243 118/688 |
| 2011/0146579 | A1 | 6/2011 | Seo et al. | |
| 2012/0292652 | A1 * | 11/2012 | Yamae | H01L 51/524 257/98 |
| 2013/0081258 | A1 * | 4/2013 | Campbell | H05K 13/00 29/592.1 |
| 2014/0318442 | A1 * | 10/2014 | Sivaramakrishnan | C30B 25/105 117/102 |
| 2014/0373784 | A1 | 12/2014 | Seo et al. | |

FOREIGN PATENT DOCUMENTS

| | | | |
|---|---|---|---|
| JP | 10-158820 | | 6/1998 |
| JP | 2004059982 A | * | 2/2004 |
| JP | 2005-310471 | | 11/2005 |
| JP | 2006-009107 | | 1/2006 |
| JP | 2006009107 A | * | 1/2006 ........... C23C 14/243 |
| JP | 2006-274284 | | 10/2006 |
| JP | 2010-111916 | | 5/2010 |
| JP | 2010-159448 | | 7/2010 |
| JP | 2011-127217 | | 6/2011 |
| JP | 4911555 | | 4/2012 |
| JP | 2013-204073 | | 10/2013 |
| WO | 2014/028603 | | 2/2014 |

OTHER PUBLICATIONS

JP2006-009107,Matsumoto, Yuji, Machine Translation in English.*
U.S. Appl. No. 15/124,170 to Akira Takiguchi, filed Sep. 7, 2016.
International Search Report issued in International Application No. PCT/JP2015/000902, dated Jun. 2, 2015, along with English-language translation.
Chinese Office Action for CN App. No. 201580012609.3 dated Nov. 29, 2017, along with partial English-language translation thereof.

* cited by examiner

VAPOR DEPOSITION APPARATUS, VAPOR DEPOSITION METHOD USING VAPOR DEPOSITION APPARATUS, AND DEVICE PRODUCTION METHOD

TECHNICAL FIELD

The present invention relates to a vapor deposition apparatus usable for manufacturing a device containing an organic substance, and a device manufacturing method in which the vapor deposition apparatus is used. In particular, the present invention relates to a vapor deposition apparatus having a vapor deposition source having eject outlets from which vapor deposition material is ejected into a chamber.

BACKGROUND ART

Devices such as organic light-emitting elements and thin film transistors (referred to in the following as TFTs) include organic functional layers having specific functions. Examples of such organic functional layers include organic light-emitting layers in organic light-emitting elements and organic semiconductor layers in TFTs. For example, a typical organic light-emitting element has a substrate, and in addition to the substrate, a metal electrode, multiple organic functional layers, and a light-transmissive electrode layer disposed in the stated order above the substrate. Each of such layers of the organic light-emitting element is usually formed by performing vacuum vapor deposition in a chamber. A typical chamber used for vacuum vapor deposition is a high vacuum chamber having a vapor deposition source at a lower portion thereof, and a substrate is placed at an upper portion of the chamber. One example of such a chamber is disclosed in Patent Literature 1. For example, the vapor deposition source has a crucible inside that accommodates an organic substance in powdery form. Further, a heating device is disposed around the crucible, and the heating device heats the crucible with infrared heat radiation. Accordingly, the organic substance accommodated in the vapor deposition source is heated to evaporate, whereby the organic substance in the form of gas spreads inside the chamber. The organic substance transforms into a solid from the gas form when coming in contact with the substrate. Thus, an organic functional layer in the form of a thin film is formed on the substrate. In connection with the above, a conventional method is proposed of closing the crucible accommodating the vapor deposition material with a lid having a plurality of eject outlets to prevent unevenness from occurring in film deposition. One example of such a method is disclosed in Patent Literature 2.

CITATION LIST

Patent Literature

[Patent Literature 1]
  Japanese Patent Application Publication No.: 2005-310471
[Patent Literature 2]
  Japanese Patent Application Publication No.: 2011-127217

SUMMARY OF INVENTION

Technical Problem

Meanwhile, in the process of forming a functional film by depositing vapor deposition material onto a substrate through vapor deposition, there are cases where very small amounts of undesirable substances, including moisture in the atmosphere, enter the inside of the chamber along with the vapor deposition material in the process of placing the vapor deposition material inside the chamber. The undesirable substances may react with the vapor deposition material and bring about degradation of material characteristics of the vapor deposition material.

The present invention aims to provide a vapor deposition apparatus, a vapor deposition method in which the vapor deposition apparatus is used, and a device manufacturing method that prevent degradation of material characteristics of vapor deposition material.

Solution to Problem

In order to achieve the aim described above, one aspect of the present invention is a vapor deposition apparatus including: a chamber that holds an object on which a film is to be deposited through vapor deposition; a vapor deposition source that is disposed inside the chamber, the vapor deposition source having a housing that accommodates therein a vapor deposition material for the vapor deposition; and a heater that heats the vapor deposition material, characterized in that the housing has a plurality of eject outlets and an air outlet that is openable and closable, the plurality of eject outlets connecting the inside of the housing with the outside of the housing and ejecting vapor of the vapor deposition material towards the object.

Advantageous Effects of Invention

In the vapor deposition apparatus pertaining to one aspect of the present invention, undesirable substances entering the inside of the housing of the vapor deposition source during a device manufacturing process are discharged to the outside of the vapor deposition source. Accordingly, the material for the vapor deposition is prevented from reacting with the undesirable substances. Thus, degradation of material characteristics of the vapor deposition material during a vapor deposition process is prevented.

DESCRIPTION OF EMBODIMENTS

Figure 1:
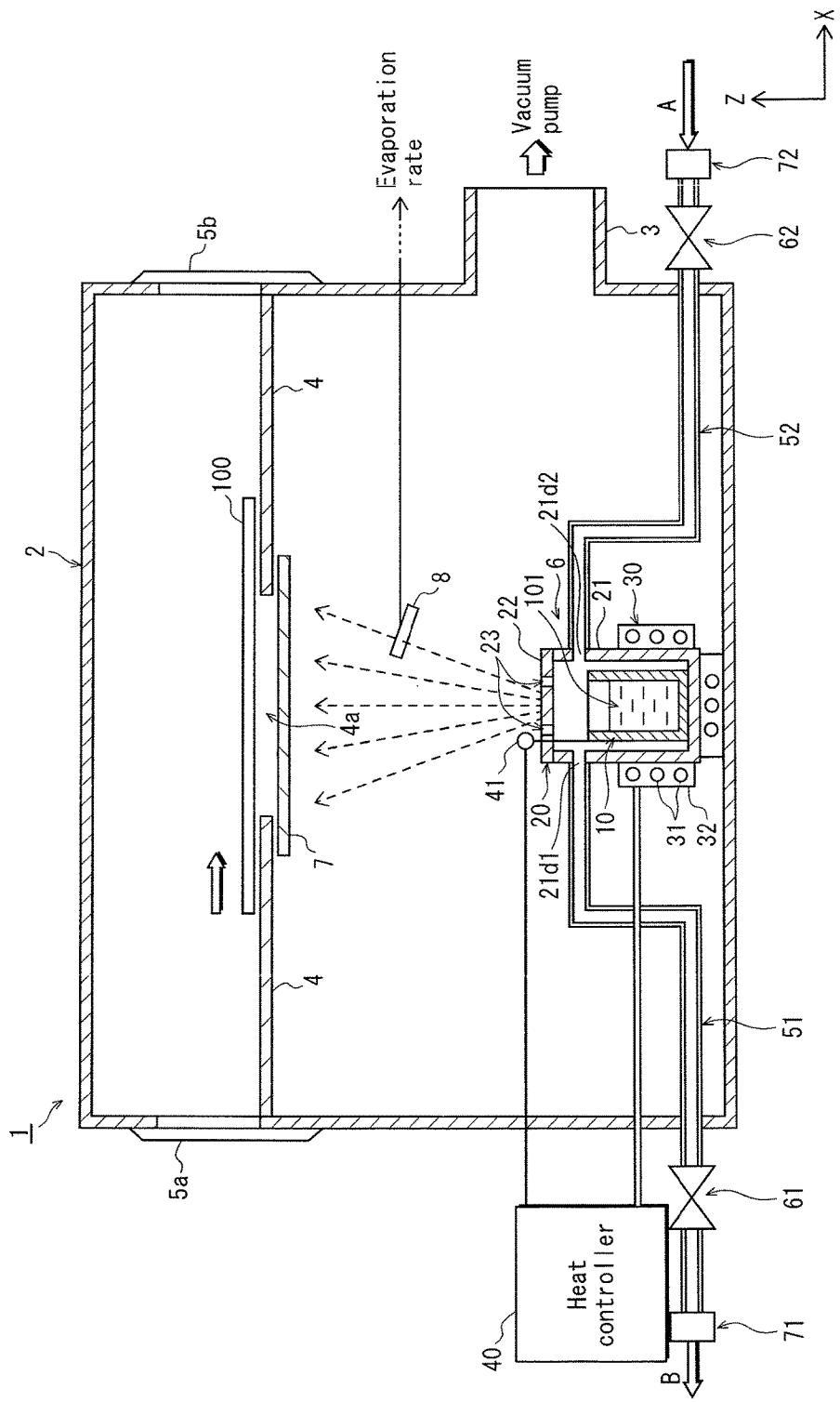
FIG. 1 is a schematic cross-sectional view illustrating the structure of a vapor deposition apparatus 1 pertaining to embodiment 1.

<<How Inventor Arrived at Embodiments of Invention>>

When performing vacuum vapor deposition with respect to a surface of a vapor deposition target (e.g., a substrate), unevenness in evaporation rate at different areas of the surface leads to the film that is formed having different thickness at different areas thereof. This, for example, leads to organic light-emitting elements with different luminance levels being formed. In particular, with a conventional spot-like vapor deposition source that is usually referred to as a "point source", there is difficulty in performing vapor deposition uniformly with respect to the entire surface of the vapor deposition target. In view of this, research is being conducted of various methods that allow uniform vapor deposition of materials onto substrates.

For example, a planar vapor deposition film can be formed on a substrate by using a linear vapor deposition source (usually referred to as a "line source") whose length in the longitudinal direction is longer than the width of the substrate, and by moving the substrate over the line source in a direction perpendicular to the longitudinal direction of the line source. One example of such a method is disclosed in Patent Literature 1. Vapor deposition performed according to this method produces a film having a higher level of uniformity in terms of thickness along the longitudinal direction of the line source as compared to a film produced by using a plurality of point sources. In this method, evaporation rate along the longitudinal direction may somewhat vary. However, this variance in evaporation rate can be overcome and a film with a high level of uniformity in terms of thickness can be formed by increasing the distance between a large-sized substrate and the line source so that material scattering ranges of different vapor deposition sources overlap. Here, note that the term "material scattering range" refers to an area at which vapor deposition material flying off from a vapor deposition source arrives. However, this method leads to an increase in chamber volume and a consequent increase in the amount of time required to create a vacuum environment in the chamber.

In connection with the above, Patent Literature 2 proposes a method of closing a crucible accommodating vapor deposition material with a lid having a plurality of eject outlets, to prevent unevenness from occurring in film deposition. According to this method, due to a top opening of a crucible being closed by a lid, vapor of vapor deposition material is expected to fill the inside of the crucible before being ejected from the eject outlets at the same pressure due to internal pressure of the crucible. Due to this, even if the temperature of the vapor deposition material differs at different areas along the longitudinal direction, vapor is ejected to the inside of the chamber at the same evaporation rate from different eject outlets by causing the vapor of the vapor deposition material to temporarily fill the inside of the crucible. Thus, it is expected that the influence that the temperature difference along the longitudinal direction has on the variance in evaporation rate in the longitudinal direction can be reduced.

However, the inventor found that this method gives rise to a different technical problem. The technical problem found by the inventor is that, when supplying the crucible in the chamber with vapor deposition material, undesirable substances may enter the inside of the crucible along with the vapor deposition material. These undesirable substances may react with the vapor deposition material and bring about degradation of material characteristics of the vapor deposition material.

The following describes this technical problem in detail. Typically, a crucible inside a chamber is supplied with vapor deposition material through the following processes.

(i) After completion of film deposition, the crucible is cooled to room temperature, and then the pressure inside the chamber is increased to atmospheric pressure.

(ii) The crucible is taken out from the chamber.

(iii) The crucible is filled with vapor deposition material. The vapor deposition material is a liquid or a solid at room temperature.

(iv) The crucible, now full of the vapor deposition material, is placed inside the chamber once again.

(v) A vacuum environment is created inside the chamber, and then the crucible is heated.

(vi) Film forming through vapor deposition is executed.

Among such processes, undesirable substances may enter the crucible along with the vapor deposition material in process (iii) when supplying the crucible with the vapor deposition material and undesirable substances may enter along with the vapor deposition material in process (iv) when placing the crucible in the chamber once again. Then, due to the heat applied in process (v), undesirable substances evaporate from the vapor deposition material or the crucible to the inside the crucible.

Here, the undesirable substances may for example be moisture and oxygen in the atmosphere, and may be originally contained in the vapor deposition material or may attach to the inner circumferential surface of the crucible when the crucible is exposed to the atmosphere. Meanwhile, this technical problem does not arise with a conventional crucible whose top opening is not blocked, due to vapors of undesirable substances spreading to the inside of the chamber and being discharged to the outside of the chamber by a vacuum device.

However, with the method of providing the lid with a plurality of eject outlets, the vapors of the undesirable substances fill the inside of the crucible and are not easily released into the chamber (or a certain amount of time is required to release the vapors of the undesirable substances into the chamber). Further, since the vapor deposition material is in a relatively active state due to the heat applied thereto while filling the inside of the crucible, the vapor deposition material is in a state where the vapor deposition material readily reacts with the undesirable substances. As a result, when an organic material is used as the vapor deposition material, degradation of the vapor deposition material occurs, such as replacement of hydrogen atoms in the molecules of the organic material with OH groups. Further, when the undesirable substances include moisture and a great amount of moisture has attached to the inside of the crucible, the internal pressure of the crucible may increase rapidly, which accelerates the degradation of the vapor deposition material.

In view of this, the inventor considered that such degradation of vapor deposition material can be effectively prevented by preventing the vapor deposition material from reacting with the undesirable substances, which enter the crucible in the process of supplying the crucible with the vapor deposition material. Accordingly, the inventor conducted intensive research for a method that, in a device manufacturing process, achieves both an organic functional layer with uniform thickness and prevention of reaction between vapor deposition material and undesirable substances having entered the crucible. Through such research, the inventor has arrived at a vapor deposition apparatus, a vapor deposition method in which the vapor deposition apparatus is used, and a device manufacturing method that are described in the following embodiments and that prevent degradation of material characteristics of vapor deposition material.

<<Overview of Aspects for Implementing Present Invention>>

One aspect of the present invention is a vapor deposition apparatus including: a chamber that holds an object on which a film is to be deposited through vapor deposition; a vapor deposition source that is disposed inside the chamber, the vapor deposition source having a housing that accommodates therein a vapor deposition material for the vapor deposition; and a heater that heats the vapor deposition material, characterized in that the housing has a plurality of eject outlets and an air outlet that is openable and closable, the plurality of eject outlets connecting the inside of the housing with the outside of the housing and ejecting vapor of the vapor deposition material towards the object.

In another aspect, the vapor deposition apparatus may further include: an air outlet tube that is connected to the air outlet and connects the inside of the housing with the outside of the chamber; and an air outlet unit that causes gas inside the housing to exit the housing to the outside of the chamber via the air outlet tube.

In another aspect of the vapor deposition apparatus, the housing may have an air inlet, and the vapor deposition apparatus may further include an air inlet tube that is connected to the air inlet and connects the inside of the housing with the outside of the chamber; and an air inlet unit that allows gas to enter the housing via the air inlet tube.

In another aspect of the vapor deposition apparatus, the air outlet may connect the inside of the housing with a space that is outside the housing and that is inside the chamber.

In another aspect, the vapor deposition apparatus may further include a valve that opens and closes the air outlet.

In another aspect of the vapor deposition apparatus, the housing may have a main body portion composed of a bottom plate and a circumferential wall around the bottom plate, and a lid portion that is disposed facing the bottom plate, the lid portion, the bottom plate, and the circumferential wall together defining a space inside the housing in which the vapor deposition material is accommodated, and the air outlet may be disposed in the main body portion and the plurality of eject outlets may be disposed in the lid portion.

In another aspect, the vapor deposition apparatus may further include a crucible that accommodates the vapor deposition material, the crucible disposed inside the housing.

Another aspect of the present invention may be vapor deposition source that is used in a vapor deposition apparatus for forming an organic layer onto an object through vapor deposition, the vapor deposition source including a housing accommodating therein a vapor deposition material for the vapor deposition, wherein the housing has a plurality of eject outlets and an air outlet that is openable and closable, the plurality of eject outlets connecting the inside of the housing with the outside of the housing and ejecting vapor of the vapor deposition material towards the object.

In another aspect, the vapor deposition source may further include a crucible that accommodates the vapor deposition material, wherein the housing may have a main body portion composed of a bottom plate and a circumferential wall around the bottom plate, and a lid portion that is disposed facing the bottom plate, the lid portion, the bottom plate, and the circumferential wall together defining a space inside the housing in which the crucible is accommodated, and the air outlet may be disposed in the main body portion and the plurality of eject outlets may be disposed in the lid portion.

One aspect of the present invention is a vapor deposition method for depositing a film of the vapor deposition material onto the object by using the vapor deposition apparatus described above, the vapor deposition method characterized for including: maintaining the vapor deposition material at a temperature around a gas separation temperature for a predetermined time period of time with the air outlet open; and after maintaining the vapor deposition material at the temperature around the gas separation temperature, vapor-depositing a film of the vapor deposition material on the object by causing the vapor of the vapor deposition material to be ejected from the plurality of eject outlets towards the object, with the vapor deposition material maintained at a vapor deposition heating temperature that is higher than the gas separation temperature and with the air outlet closed.

In another aspect of the vapor deposition method, in maintaining the vapor deposition material at the temperature around the gas separation temperature, the vapor deposition material may be heated while discharging gas inside the housing to the outside of the chamber via an air outlet tube that connects the air outlet with the outside of the chamber.

In another aspect of the vapor deposition method, in maintaining the vapor deposition material at the temperature around the gas separation temperature, the vapor deposition material may be heated while introducing gas inside the housing via an air inlet tube that connects an air inlet disposed in the housing with the outside of the chamber, and in vapor-depositing the film of the vapor deposition material on the object, the vapor deposition material may be vapor-deposited on the object with the air inlet closed.

In another aspect of the vapor deposition method, in maintaining the vapor deposition material at the temperature around the gas separation temperature, the vapor deposition material may be heated while introducing gas inside the housing via an air inlet tube that connects an air inlet disposed in the housing with the outside of the chamber, and in vapor-depositing the film of the vapor deposition material on the object, the vapor deposition material may be vapor-deposited on the object while gas is introduced inside the housing via the air inlet.

In another aspect of the vapor deposition method, in maintaining the vapor deposition material at the temperature around the gas separation temperature, the vapor deposition material may be heated while discharging gas inside the housing to a space that is outside the housing and that is inside the chamber via the air outlet, and in vapor-depositing the film of the vapor deposition material on the object, the vapor deposition material may be vapor-deposited on the object with the air inlet closed.

One aspect of the present invention is a device manufacturing method characterized in that the film of the vapor deposition material is formed on the object by using the vapor deposition method described above.

Embodiment 1

The following describes a vapor deposition apparatus pertaining to the present embodiment and a device manufacturing method pertaining to the present embodiment in which the vapor deposition apparatus is used, with reference to the accompanying drawings.

<Vapor Deposition Apparatus 1>

(Overall Structure)

FIG. 1 is a schematic cross-sectional view illustrating the structure of a vapor deposition apparatus 1 pertaining to embodiment 1. The vapor deposition apparatus 1 performs vapor deposition of a vapor deposition substance onto a surface of a substrate 100. As illustrated in FIG. 1, the vapor deposition apparatus 1 includes a chamber 2. The chamber 2 has a chamber air outlet 3 that is connected to an undepicted vacuum pump. Thus, a vacuum environment can be created and maintained inside the chamber 2. The space inside the chamber 2 is partitioned into a top part and a bottom part by a partition plate 4, and the substrate 100 is moved above the partition plate 4. The chamber 2 has a lateral wall provided with an entrance 5a and an exit 5b. The substrate 100 is transported into the chamber 2 via the entrance 5a and transported out of the chamber 2 via the exit 5b. Specifically, a transport means transports the substrate 100 into the chamber 5 via the entrance 5a, transports the substrate 100 over the partition plate 4, and transports the substrate 100 out of the chamber 2 via the exit 5b. Note that the transport means transports a plurality of substrates 100 one by one.

Below the partition plate 4 in the chamber 2, a vapor deposition source 6 is disposed. The vapor deposition source 6 ejects the vapor deposition material. The vapor deposition substance ejected from the vapor deposition source 6 is, for example, a substance for forming an electrode or a functional layer of an organic EL element, and may be an inorganic substance or an organic substance. Examples of such inorganic substances include metal materials such as Al for forming a cathode, Ba, Ni, Li, Mg, Au, and Ag, and metal oxide materials such as $MgF_2$, $SiO_2$, and $Cr_2O_3$. Examples of such organic substances include diamine, TPD, coumarin, and quinacridone, which are organic substances used for forming organic EL element functional layers.

The partition plate 4 has a window 4a formed therein. The window 4a allows the vapor deposition substance ejected from the vapor deposition source 6 to pass through. Further, the window 4a is exposed or blocked by a shutter 7. In the vapor deposition apparatus 1 having such a structure, by transporting the substrate 100 while the shutter 7 is open and the vapor deposition substance is being ejected from the vapor deposition source 6, the vapor deposition substance passes through the window 4a and is vapor-deposited onto a bottom surface of the substrate 100.

Inside the chamber 2, a sensor 8 is disposed that measures the amount of vapor deposition substance supplied from the vapor deposition source 6 to the substrate 100 per unit time. In other words, the sensor 8 measures the evaporation rate of the vapor deposition substance. The evaporation rate measured by the sensor 8 is used to set the transportation speed of the substrate 100, and the like. When depositing the vapor deposition substance to form a predetermined pattern on the substrate 100, vapor deposition is performed with a mask having the predetermined pattern formed therein attached to the bottom surface of the substrate 100.

Figure 2:
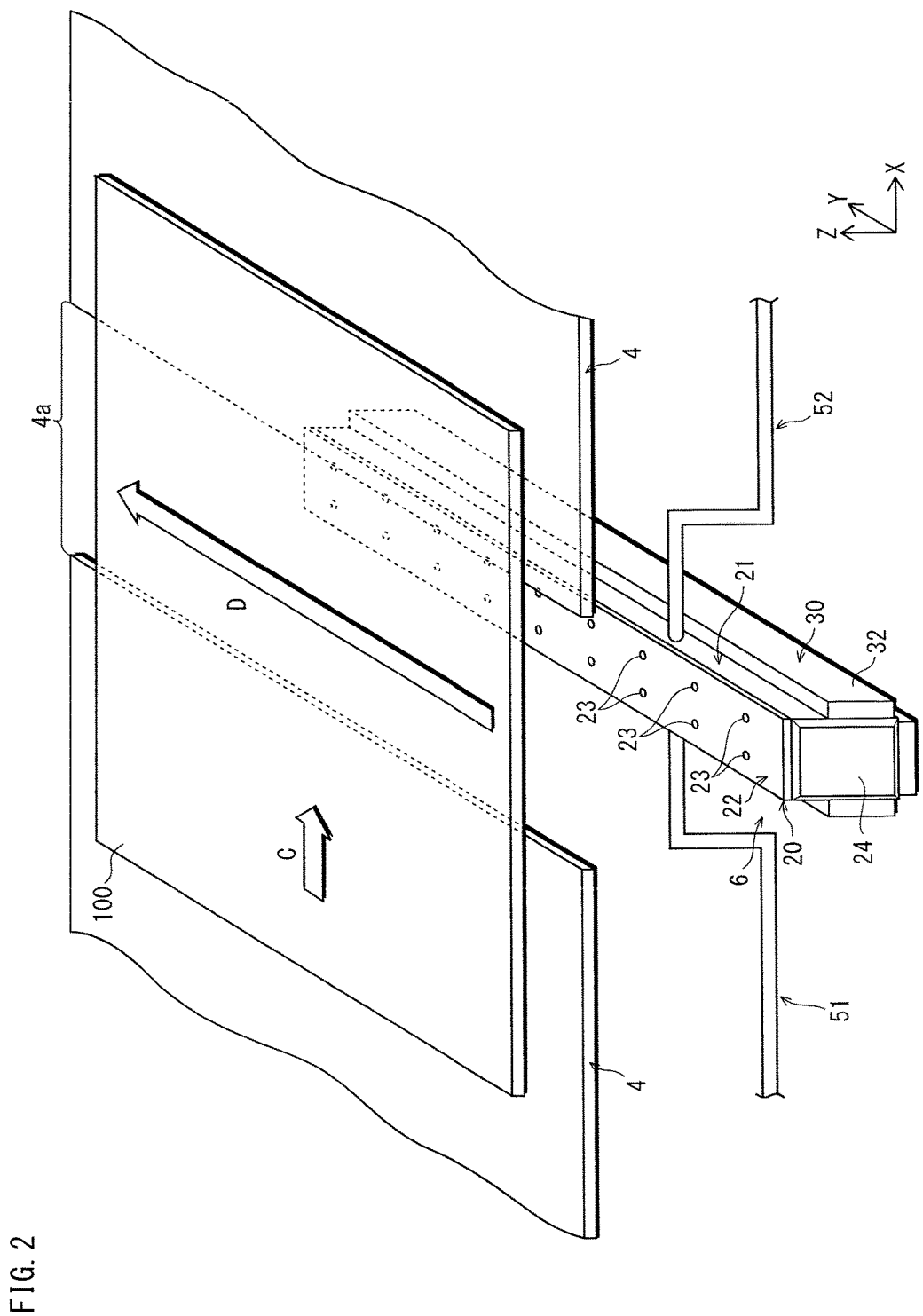
FIG. 2 is a schematic illustrating how a vapor deposition substance is vapor-deposited onto a substrate inside the vapor deposition apparatus 1.

FIG. 2 is a schematic illustrating how the vapor deposition substance is vapor-deposited onto the substrate 100 inside the vapor deposition apparatus 1. FIG. 2 illustrates the vapor deposition apparatus 1 with the window 4a exposed. Further, as illustrated in FIG. 2, the vapor deposition source 6 is a so-called line source, having a linear shape and extending in a width direction D. The width direction D is a direction perpendicular to the direction C in which the substrate 100 is transported (referred to in the following as a transport direction C). While the substrate 100 is being transported in the transport direction C, the vapor deposition substance from the vapor deposition source 6 passes through the window 4a and is vapor-deposited onto the bottom surface of the substrate 100.

(Vapor Deposition Source 6)

Figure 3:
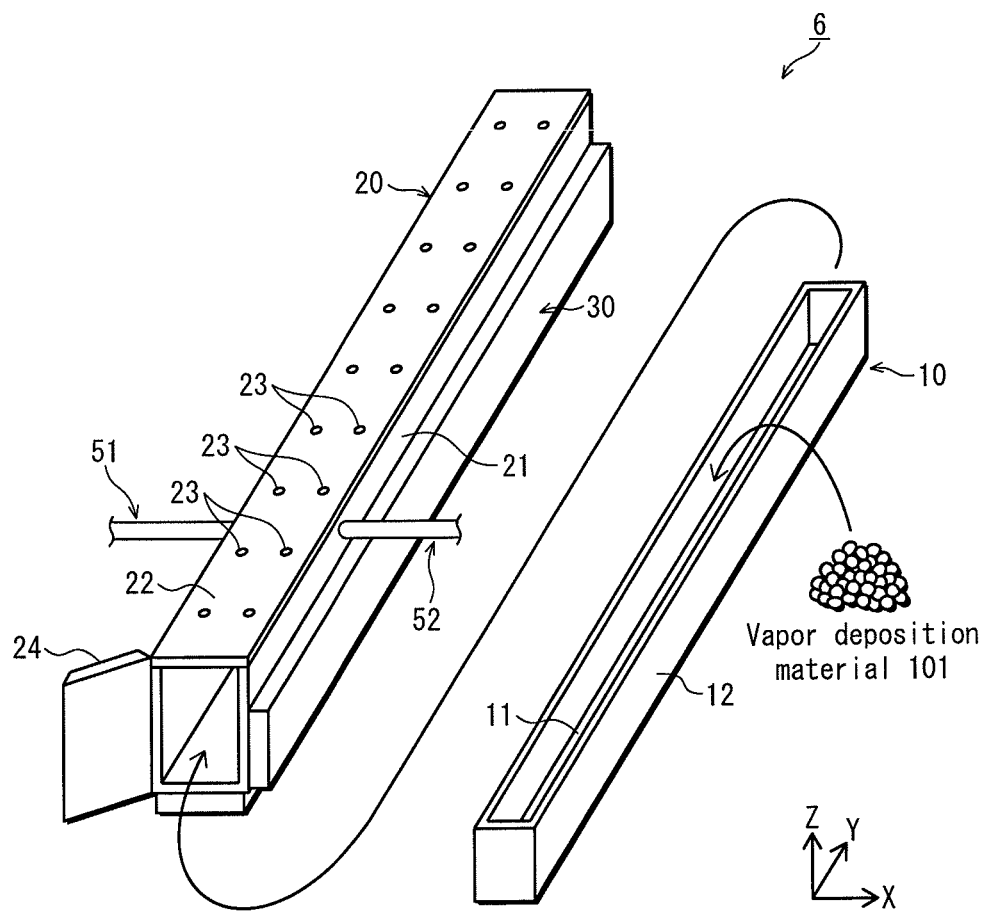
FIG. 3 is a perspective view illustrating the structure of a vapor deposition source 6 pertaining to embodiment 1.
Figure 4:
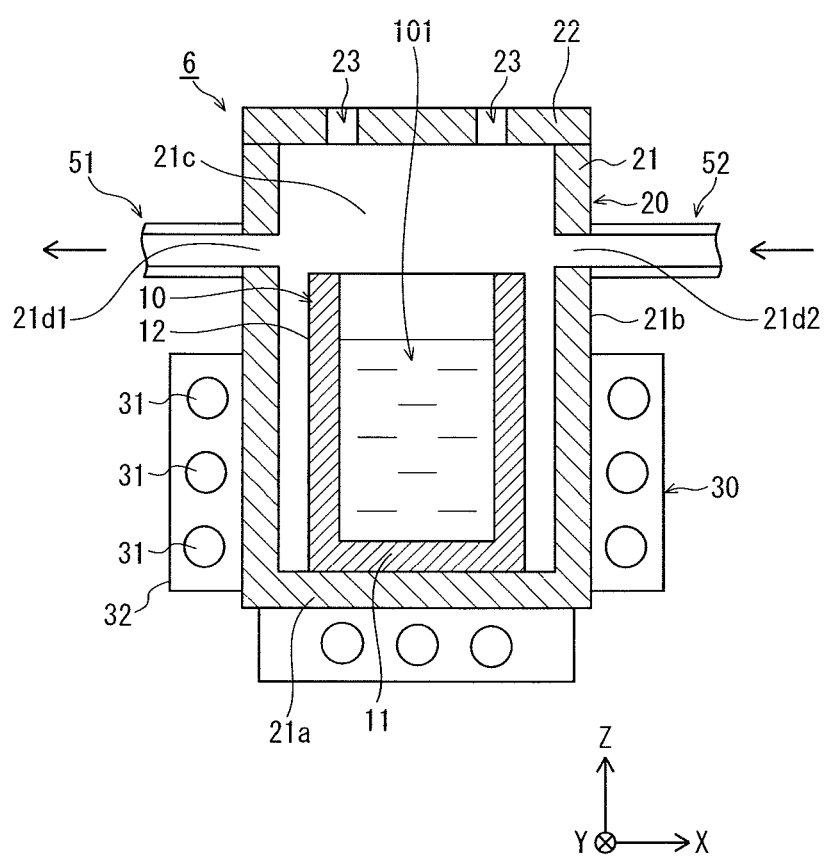
FIG. 4 is a schematic cross-sectional view illustrating the vapor deposition source 6 pertaining to embodiment 1.

FIG. 3 is a perspective view illustrating the structure of the vapor deposition source 6. FIG. 4 is a schematic cross-sectional view illustrating the vapor deposition source 6. The vapor deposition source 6 includes a crucible 10, a housing 20, and a heater 30. The housing 20 and the heater 30 are installed in the bottom part space of the chamber 2. The crucible 10 accommodates a vapor deposition material 101 that becomes the vapor deposition substance. The housing 20 accommodates the crucible 10 therein. The heater 30 covers the circumference of the housing 20 and the bottom of the housing 20. The crucible 10 is a container that has an elongated shape and that contains the vapor deposition material 101. The crucible 10 has a bottom plate 11 and a lateral plate 12, and the top of the crucible 10 is open. For example, the crucible 10 can be manufactured by molding a plate of stainless steel into a cuboid shape. Examples of materials other than stainless steel that can be used for manufacturing the crucible 10 include plates of carbon, titanium, tantalum, and molybdenum. Meanwhile, the housing 20 has the shape of an elongated cuboid having an internal space in which the crucible 10 can be accommodated.

The housing 20 is composed of a main body 21, a lid 22, and a door 24. The main body 21 has an elongated cuboid shape and defines a concave space 21c for accommodating the crucible 10. The lid 22 covers a top opening of the concave space 21c. The door 24 is openable/closable. The door 24, when open, exposes an opening at one end of the main body 21, whereas the door 24, when closed, blocks the opening at the end. Further, the lid 22 has lines of eject outlets 23 disposed therein. The main body 21, the lid 22, and the door 24 are each manufactured by molding a metal plate (e.g., a plate of stainless steel).

The main body 21 has a rectangular bottom plate 21a and a circumferential wall 21b. The lid 22 is fixed on top of the circumferential wall 21b by using a screw and/or the like. The door 24 is attached in openable/closable state to the above-described end of the main body 21 by using a hinge and/or the like.

The circumferential wall 21b of the main body 21 has at least one air outlet 21d1 formed therein. The air outlet 21d1 is for discharging gases inside the housing 20 to the outside of the housing 20. Here, configuring the air outlet 21d1 to occupy a greater area than each eject outlet 23 shortens the amount of time required for the discharge of gases. Further, the air outlet 21d1 is connected to an air outlet tube 51. The air outlet tube 51 connects the inside of the housing 20 with the outside of the chamber 2, and is connected to an air outlet means 71. The air outlet means 71 is a means that provides active ventilation, such as a vacuum pump or a suction pump, or a means that provides passive ventilation, such as a check valve or a vent pipe. Further, the air outlet tube 51 has a valve 61 disposed along the path leading to the air outlet means 71. The valve 61 is a mechanism for opening and closing the air outlet 21d1. Thus, the air outlet 21d1 is configured to be openable/closable. Specifically, gases inside the housing 20 can be discharged to the outside of the chamber 2 via the air outlet tube 51 by operating the air outlet means 71 and opening the valve 61 (this discharge of gases illustrated by arrow B in FIG. 1).

Further, the circumferential wall 21b of the main body 21 has at least one air inlet 21d2 formed therein. The air inlet 21d2 is for introducing a gas to the inside of the housing 20. The air inlet 21d2 is connected to an air inlet tube 52. The air inlet tube 52 connects the inside of the housing 20 with the outside of the chamber 2, and is connected to an air inlet means 72. For example, the air inlet means 72 is composed of a tank filled with an inert gas such as argon, and a pump that is connected to the tank and supplies the gas. Further, the air inlet tube 52 has a valve 62 disposed along the path leading to the air inlet means 72. The valve 62 is a mechanism for opening and closing the air inlet 21d2. Thus, the air inlet 21d2 is configured to be openable/closable. Specifically, gas (e.g., inert gas) can be introduced to the inside of the housing 20 via the air inlet tube 52 by operating the air inlet means 72 and opening the valve 62 (this introduction of gas is illustrated by arrow A in FIG. 1). Further, gases inside the housing 20 can be discharged to the outside of the chamber 2 via the air outlet tube 51 by operating the air outlet means 71 and opening the valve 61, at the same time as introducing gas to the inside of the housing 20 by operating the air inlet means 72 and opening the valve 62. Here, when the air outlet means 71 is a means that provides active ventilation, the air outlet means 71 forcibly discharges gases inside the housing 20 to the outside of the chamber 2 via the air outlet tube 51. Meanwhile, when the air outlet means 71 is a means that provides passive ventilation, such as a check valve or a vent pipe, gases inside the housing 20 can be discharged to the outside of the housing 20 through the pushing effect of inert gas introduced into the housing 20.

The heater 30 is disposed to cover the bottom plate 21a of the main body 21 and a lower part of the outside surface of the circumferential wall 21b of the main body 21. For example, the heater 30 is composed of a combination of a heater case 32 and a plurality of sheath heaters 31 accommodated inside the heater case 32. The heater 30 is connected to a heat controller 40. Further, the housing 20 has attached thereto a temperature sensor 41 that measures the temperature of the vapor deposition source 6. The heat controller 40 monitors the temperature measured by the temperature sensor 41, and controls output of the heater 30 so that the temperature measured by the temperature sensor 41 equals certain preset temperatures (refer to the temperature profile illustrated in FIG. 5A).

With the vapor deposition source 6 having the above-described structure, vapor generated by heating the vapor deposition material 101 inside the crucible 10 by using the heater 30 (i.e., the vapor deposition substance) fills the housing 20 before being ejected from the eject outlets 23 disposed in the lid 22 in lines. In the vapor deposition source 6, the lid 22 closes the top opening of the main body 21. The top opening is located above the crucible 10. Due to this, the vapor deposition substance so generated (i.e., the vapor of the vapor deposition material 101), after filling the inside of the housing 20, is ejected from the respective eject outlets 23 at the same pressure due to the internal pressure of the housing 20. That is, the internal space of the housing 20 functions as a buffer that temporarily stores therein the vapor of the vapor deposition material 101, and with the internal pressure of the housing 20 slightly higher than the pressure outside the housing 20, the vapor deposition substance is ejected in regulated state from the respective eject outlets 23, which are disposed in lines extending along the Y direction. According to this method, even when the temperature of the vapor deposition material differs at different portions thereof along the longitudinal direction before evaporation, vapor of the vapor deposition material is ejected into the chamber 2 at a uniform evaporation rate due to the vapor temporarily filling the inside of the housing 20 before being ejected into the chamber 2. As a result, the film formed through the vapor deposition has a high level of uniformity in terms of thickness along the substrate width direction.

<Vapor Deposition Processes with Vapor Deposition Apparatus 1>

Figure 5A:
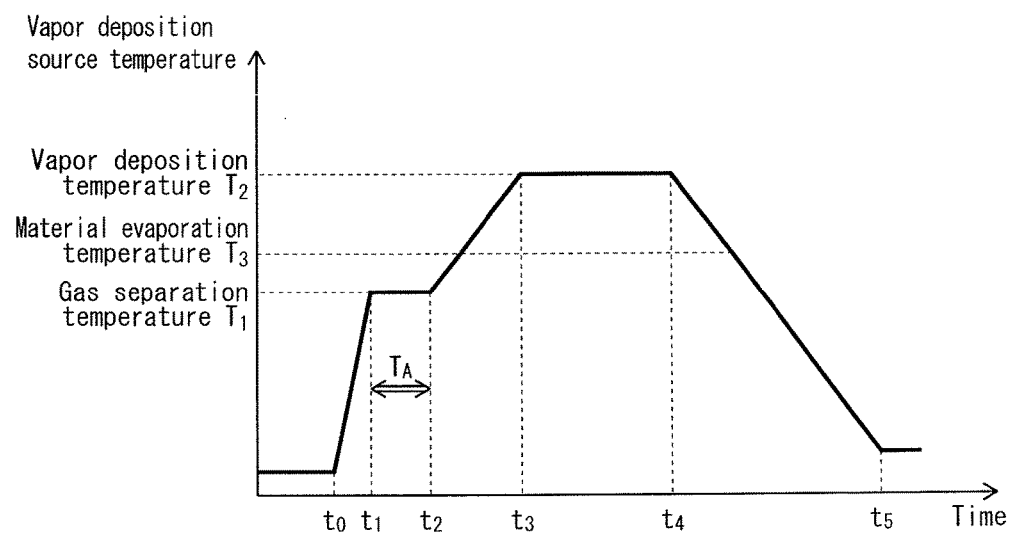
FIG. 5A illustrates one example of a temperature profile of the vapor deposition source 6 in a vapor deposition method in which the vapor deposition apparatus 1 pertaining to embodiment 1 is used.
Figure 5B:
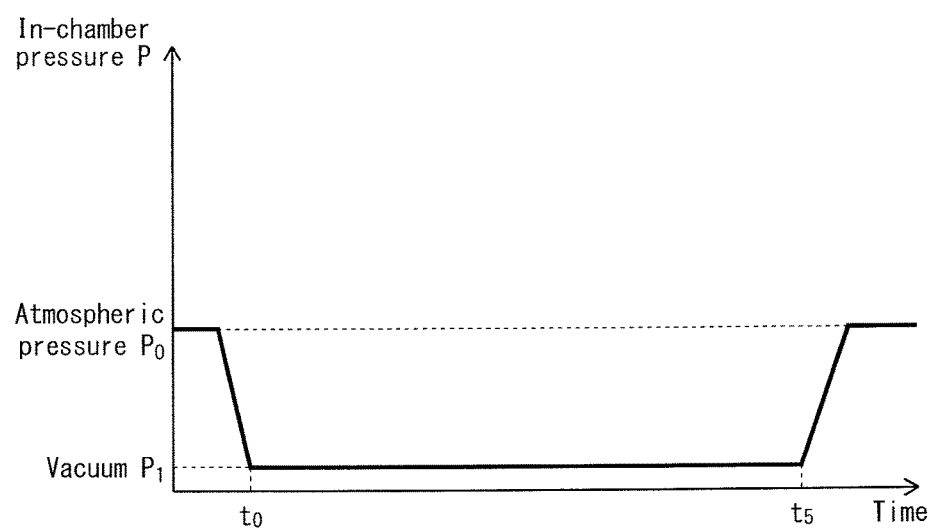
FIG. 5B illustrates one example of a pressure profile inside a chamber 2.

The following describes the processes involved in performing vapor deposition with respect to a surface of the substrate 100 by using the vapor deposition apparatus 1. FIG. 5A illustrates one example of a temperature profile indicating preset temperatures at different time points during control of the temperature of the vapor deposition source 6 in the vapor deposition apparatus 1. FIG. 5B illustrates one example of a pressure profile inside the chamber 2. In the vapor deposition apparatus 1, the temperature and the pressure of the vapor deposition source 6 are controlled based on the temperature profile illustrated in FIG. 5A.

First, the crucible 10 is filled with the vapor deposition material 101, the crucible 10 is placed in the housing 20 inside the chamber 2, and the door 24 is closed, as illustrated in FIG. 3.

Then, with the shutter 7 shut, a substrate 100 is transported inside the chamber 2 via the entrance 5a and the vacuum pump is actuated to reduce the pressure inside the chamber 2 from atmospheric pressure $P_0$ to vacuum pressure $P_1$.

When the pressure inside the chamber 2 has been dropped to vacuum pressure $P_1$ at time point $t_0$, the heater 30 of the vapor deposition source 6 is actuated with a vacuum environment maintained in the chamber 2, to heat the crucible 10. Between time point $t_0$ and time point $t_1$, at which the temperature of the vapor deposition source 6 reaches a gas separation temperature $T_1$, the temperature of the vapor deposition source 6 is increased at a steep temperature gradient. Note that the gas separation temperature $T_1$ is a temperature at which gases of undesirable substances are emitted from the vapor deposition material. Specifically, the gas separation temperature $T_1$ is a temperature at which undesirable substances including moisture attaching to the vapor deposition material 101 separate from the vapor deposition material 101, and is within a range of for example 100 degrees Celsius to 200 degrees Celsius. Here, it is expected that by starting to heat the crucible 10 with the pressure inside the chamber 2 reduced to the vacuum pressure $P_1$, the heating of the crucible 10 can be started with undesirable substances inside the chamber 2 having been removed to a certain extent. Due to this, for example, it is assumed that the reaction between undesirable substances in the chamber 2 and the vapor deposition material can be reduced compared to when the heating of the crucible 10 is started with the pressure inside the chamber 2 remaining at atmospheric pressure $P_0$.

Subsequently, during time period $T_A$ between time point $t_2$ and time point $t_1$, at which the temperature of the vapor deposition source 6 reaches the gas separation temperature $T_1$, the temperature of the vapor deposition source 6 is kept at a fixed temperature around the gas separation temperature $T_1$ or at a moderate temperature gradient.

Meanwhile, during time period $T_A$, a gas (e.g., inert gas) is introduced to the inside of the housing 20 via the air inlet tube 52 by operating the air inlet means 72 and opening the valve 62. At the same time, gases inside the housing 20 are discharged to the outside of the chamber 2 via the air outlet tube 51 by operating the air outlet means 71 and opening the valve 61. Forcing the gases inside the housing 20 to exit the housing 20 by introducing the inert gas into the housing 20 and causing the inert gas so introduced to push out the gases inside the housing 20 achieves a relatively short time period $T_A$ (i.e., time period required for discharging the gases inside the housing 20 to the outside of the housing 20) compared to performing only discharge in the manner described in the following. Specifically, the length of the time period $T_A$ can be determined, for example, by performing analysis of gases to measure the amount of undesirable substances discharged from the vapor deposition material when heated, and determining the amount of time required for sufficient removal of the undesirable substances based on the amount of undesirable substances discharged.

Further, a configuration is made such that the temperature of the vapor deposition source 6 during the discharge period is equal to or higher than the gas separation temperature $T_1$ and is lower than a temperature $T_2$ to which the vapor deposition source 6 is heated during vapor deposition (referred to in the following as a vapor deposition temperature $T_2$). This configuration allows evaporating the undesirable substances but not the vapor deposition material 101 during the discharge period. Consequently, this configuration prevents unnecessary consumption of the vapor deposition material, and thus contributes to low cost.

During the time period between time points $t_2$ and $t_3$, which follows the gas separation time period between time points $t_1$ and $t_2$, introduction of gas into the housing 20 is stopped by stopping the air inlet means 72 and closing the valve 62. Also, discharge of gases to the outside of the chamber 2 is stopped by stopping the air outlet means 71 and closing the valve 61.

Further, during the time period between time points $t_2$ and $t_3$, the temperature of the vapor deposition source 6 is increased to the vapor deposition temperature $T_2$. The vapor deposition temperature $T_2$ is higher than temperature $T_3$ at which the vapor deposition material 101 inside the crucible 10 starts to evaporate, and is within a range of for example 250 degrees to 350 degrees Celsius.

During the time period between time points $t_3$ and $t_4$, vapor deposition onto the substrate 100 is performed with the vapor deposition source 6 maintained at the vapor deposition temperature $T_2$. Specifically, once the evaporation rate of the vapor deposition material 101, which is measured by the sensor 8, becomes stable, the shutter 7 is opened, and the vapor deposition substance is deposited onto the bottom surface of the substrate 100 through vapor deposition while the substrate 100 is being transported. Thus, the vapor deposition substance is deposited uniformly onto the bottom surface of the substrate 100.

Once the vapor deposition with respect to the substrate 100 is completed, the shutter 7 is closed and the substrate 100 is removed through the exit 5b. Vapor deposition with respect to a plurality of substrates 100 can be performed by repeating the processes up to this point.

When the amount of the vapor deposition material 101 remaining inside the crucible 10 becomes small due to the execution of the vapor deposition, the crucible 10 is supplied with the vapor deposition material 101 after lowering the temperature of the vapor deposition source 6, stopping the vacuum pump, and removing the crucible 10 from the housing 20 by opening the door 24.

In the description provided above, gas introduction/discharge is stopped during the time period between time points $t_0$ and $t_1$ and the time period between time points $t_2$ and $t_3$, which are time periods during which the temperature of the vapor deposition source 6 is increased, and the time period between time points and $t_5$, which is a time period during which the temperature of the vapor deposition source 6 is decreased. However, gas introduction/discharge may be continued while the temperature of the vapor deposition source 6 is being increased and while the temperature of the vapor deposition source 6 is being decreased.

<Effects>

As described above, in the vapor deposition process in which the vapor deposition apparatus 1 is used, the introduction of gas into the housing 20 and the discharge of gases inside the housing 20 to the outside of the chamber 2 are performed at the same time for a predetermined time period $T_A$, with the temperature of the vapor deposition source 6 kept around the gas separation temperature $T_1$. Accordingly, undesirable substances having entered the housing 20 of the vapor deposition source 6 along with the vapor deposition material 101 during the supply of the vapor deposition material 101 are discharged to the outside of the housing 20.

As already described above, a conventional vapor deposition apparatus may have the eject outlets 23 provided to the lid 22 of the vapor deposition source 6. The eject outlets 23 are provided to limit the communication between the housing 20 and the chamber 2, and to thereby increase the internal pressure of the housing 20. Thus, such a conventional vapor deposition apparatus is characterized in that vapors of undesirable substances fill the inside of the housing 20 and are not easily released into the chamber 2 (or a certain amount of time is required to release the vapors of the undesirable substances into the chamber 2). Further, the vapor deposition material 101, when heated, is in a relatively active state, and thus is in a state where the vapor deposition material 101 readily reacts with undesirable substances. Thus, particularly when an organic material is used as the vapor deposition material 101, degradation of the vapor deposition material 101, such as replacement of hydrogen atoms in the molecules of the organic material with OH groups, occurs in the conventional vapor deposition apparatus. Further, when the undesirable substances include moisture and a great amount of moisture has attached to the inside of the housing 20 in the conventional vapor deposition apparatus, the internal pressure of the housing 20 may increase rapidly, which accelerates the degradation of the vapor deposition material.

Meanwhile, in the vapor deposition apparatus 1 pertaining to the present embodiment, undesirable substances having entered the housing 20 of the vapor deposition source 6 along with the vapor deposition material 101 can be discharged to the outside of the housing 20. Thus, reaction between the undesirable substances and the vapor deposition material can be prevented. Further, degradation of material characteristics of the vapor deposition material is prevented from occurring during the vapor deposition process. In addition, maintaining the temperature around the gas separation temperature $T_1$ prevents rapid evaporation of undesirable substances.

Embodiment 2

Figure 6:
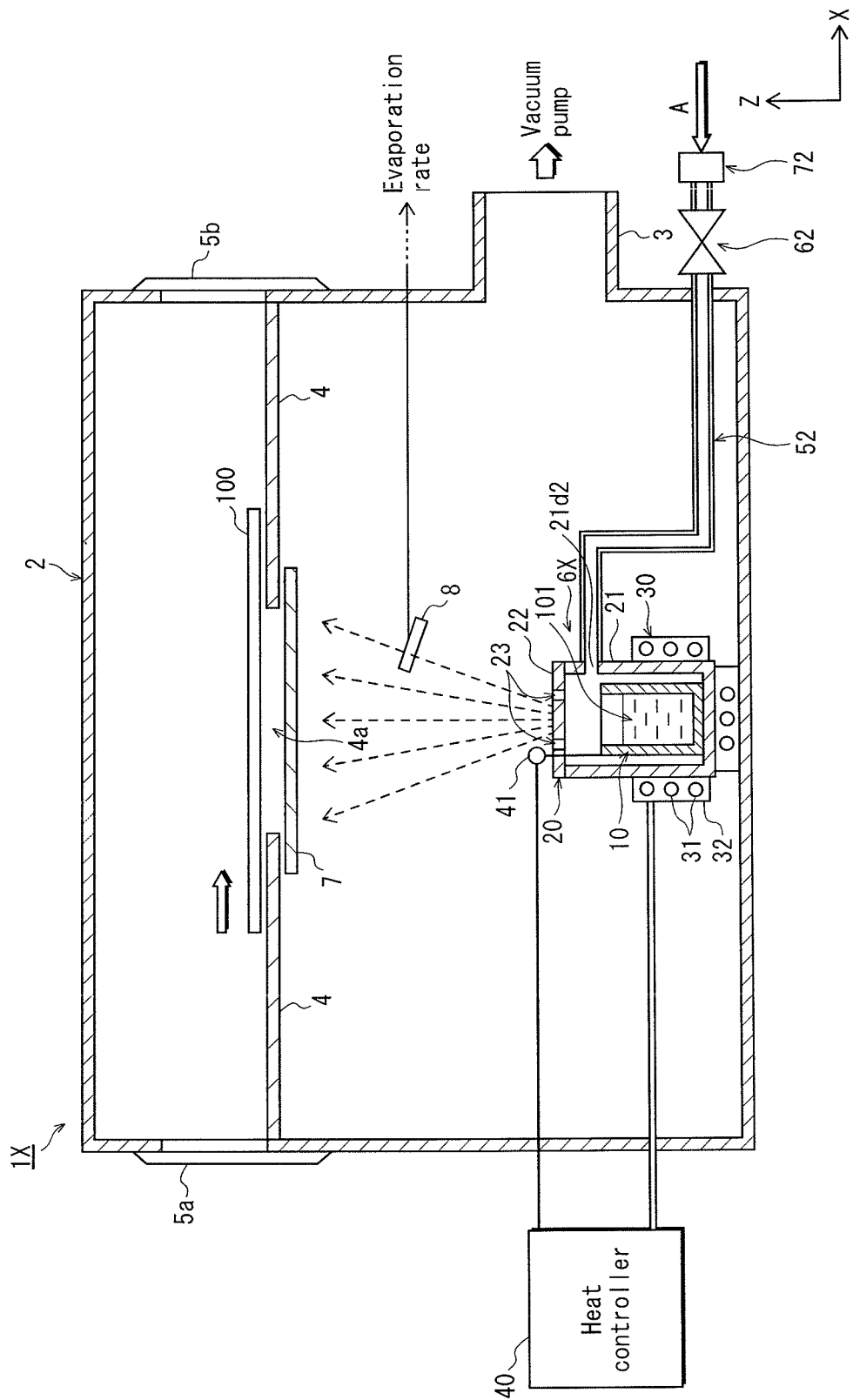
FIG. 6 is a schematic cross-sectional view illustrating the structure of a vapor deposition apparatus 1X pertaining to embodiment 2.

FIG. 6 is a schematic cross-sectional view illustrating the structure of a vapor deposition apparatus 1X pertaining to embodiment 2. The vapor deposition apparatus 1X has a structure that can be yielded by removing the air outlet 21d1, the air outlet tube 51, the air outlet means 71, and the valve 61 from the vapor deposition apparatus 1 pertaining to embodiment 1. Other than that, the vapor deposition apparatus 1X is structurally similar to the vapor deposition apparatus 1.

A vapor deposition method in which the vapor deposition apparatus 1X is used, similar to the vapor deposition method in which the vapor deposition apparatus 1 is used, is characterized in that the introduction of gas into the housing 20 and the discharge of gases inside the housing 20 to the outside of the chamber 2 are performed at the same time for the predetermined time period $T_A$, with the temperature of the vapor deposition source 6X kept around the gas separation temperature $T_1$. Further, in the vapor deposition apparatus 1X, the air inlet 21d2 of the vapor deposition source 6X is connected to the air inlet tube 52, as illustrated in FIG. 6. The air inlet tube 52 is connected to the air inlet means 72. Further, the vapor deposition apparatus 1X is operated according to the temperature profile illustrated in FIG. 5A and the pressure profile illustrated in FIG. 5B. Here, with the temperature of the vapor deposition source 6X maintained around the gas separation temperature $T_1$, a gas (e.g., inert gas) is introduced to the inside of the housing 20 via the air inlet tube 52 for the predetermined time period $T_A$ illustrated in FIG. 5A, by operating the air inlet means 72 and opening the valve 62, which is a mechanism for opening and closing the air inlet 21d2 (this introduction of gas is illustrated by arrow A in FIG. 6). Accordingly, undesirable substances introduced along with the vapor deposition source 6X during supply of the vapor deposition material 101 are discharged to the outside of the chamber 2 with the vapor deposition apparatus 1X, as well as with the vapor deposition apparatus 1. Thus, degradation of material characteristics of the vapor deposition material is prevented from occurring during the vapor deposition process.

Further, gas introduction may be continued during the vapor deposition process, by keeping the valve 62 open. This achieves discharging undesirable substances to the outside of the chamber 2 even during the vapor deposition process. Note that in this case, the discharge of gases utilizing the air outlet means 71, which is performed with the vapor deposition apparatus 1, is not performed. Due to this, the vapor deposition material is prevented from being discharged to the outside of the chamber 2 during the vapor deposition process.

Further, in the vapor deposition apparatus 1X, gas introduction/discharge is stopped during the time period between time points $t_0$ and $t_1$ and the time period between time points $t_2$ and $t_3$, which are time periods during which the temperature of the vapor deposition source 6X is increased, and the time period between time points $t_4$ and $t_5$, which is a time period during which the temperature of the vapor deposition source 6X is decreased. However, gas introduction/discharge may be continued while the temperature of the vapor deposition source 6X is being increased and while the temperature of the vapor deposition source 6X is being decreased.

Embodiment 3

In the above, description is provided of the vapor deposition apparatus 1 pertaining to embodiment 1 and the vapor deposition method in which the vapor deposition apparatus 1 is used. However, the present invention is not only implementable as exemplified in embodiment 1. That is, the structure exemplified in embodiment 1 can be modified as follows. In the vapor deposition apparatus 1 pertaining to embodiment 1 and the vapor deposition method in which the vapor deposition apparatus 1 is used, the introduction of gas into the housing 20 and the discharge of gases inside the housing 20 to the outside of the chamber 2 are performed at the same time for a predetermined time period $T_A$, with the temperature of the vapor deposition source 6 kept around the gas separation temperature $T_1$. However, the present invention is implementable with other structures such as the structure described in the following, as long as undesirable substances having been introduced along with the vapor deposition material 101 can be discharged to the outside of the housing 20.

Figure 7:
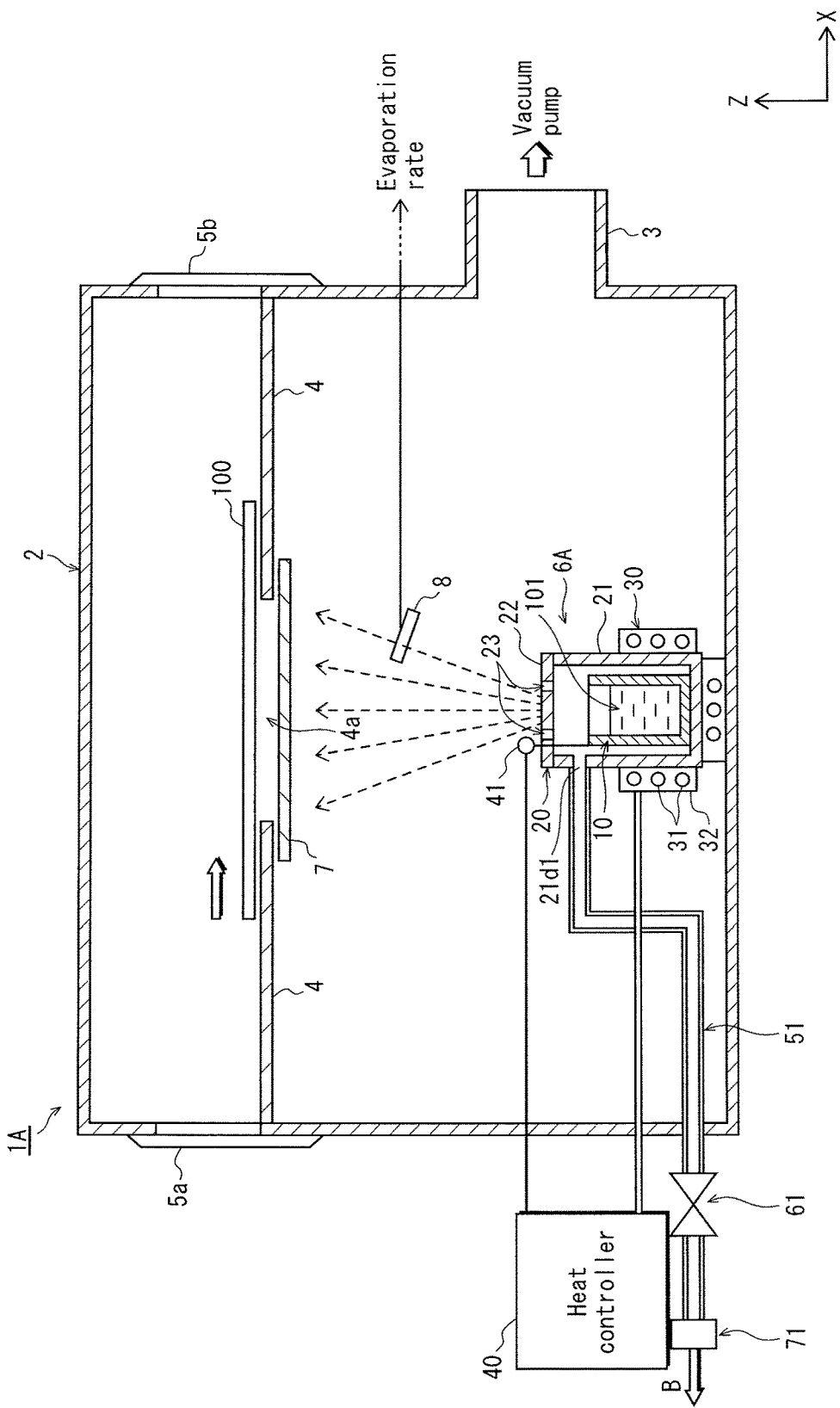
FIG. 7 is a schematic cross-sectional view illustrating the structure of a vapor deposition apparatus 1A pertaining to embodiment 3.

FIG. 7 is a schematic cross-sectional view illustrating the structure of a vapor deposition apparatus 1A pertaining to embodiment 3. The vapor deposition apparatus 1A has a structure that can be yielded by removing the air inlet 21d2, the air inlet tube 52, the air inlet means 72, and the valve 62 from the vapor deposition apparatus 1 pertaining to embodiment 1. Other than that, the vapor deposition apparatus 1A is structurally similar to the vapor deposition apparatus 1.

In the vapor deposition apparatus 1A, the air outlet 21d1 of the vapor deposition source 6A is connected to the air outlet tube 51, as illustrated in FIG. 7. The air outlet tube 51 is connected to the air outlet means 71. The vapor deposition apparatus 1A is operated according to the temperature profile illustrated in FIG. 5A and the pressure profile illustrated in FIG. 5B. Further, with the temperature of the vapor deposition source 6A maintained around the gas separation temperature $T_1$, gases inside the housing 20 are discharged to the outside of the chamber 2 via the air outlet tube 51 for the predetermined time period $T_A$ illustrated in FIG. 5A, by operating the air outlet means 71 and opening the valve 61, which is a mechanism for opening and closing the air outlet 21d1. The air outlet means 71 is a means that provides active ventilation, such as a vacuum pump or a suction pump, or a means that provides passive ventilation, such as a check valve or a vent pipe. Accordingly, undesirable substances introduced along with the vapor deposition material 101 during supply of the vapor deposition material 101 are discharged to the outside of the chamber 2 with the vapor deposition apparatus 1A, as well as with the vapor deposition apparatus 1. Thus, degradation of material characteristics of the vapor deposition material is prevented from occurring during the vapor deposition process. In addition, in order to prevent the vapor deposition material 101 from being discharged to the outside of the chamber 2 during the vapor deposition process, the discharge of gases is beneficially stopped during the vapor deposition process by closing the valve 61.

Further, in the vapor deposition apparatus 1A, gas introduction/discharge is stopped during the time period between time points $t_0$ and $t_1$ and the time period between time points $t_2$ and $t_3$, which are time periods during which the temperature of the vapor deposition source 6A is increased, and the time period between time points $t_4$ and $t_5$, which is a time period during which the temperature of the vapor deposition source 6A is decreased. However, gas introduction/discharge may be continued while the temperature of the vapor deposition source 6A is being increased and while the temperature of the vapor deposition source 6A is being decreased.

<Modification>

Figure 8:
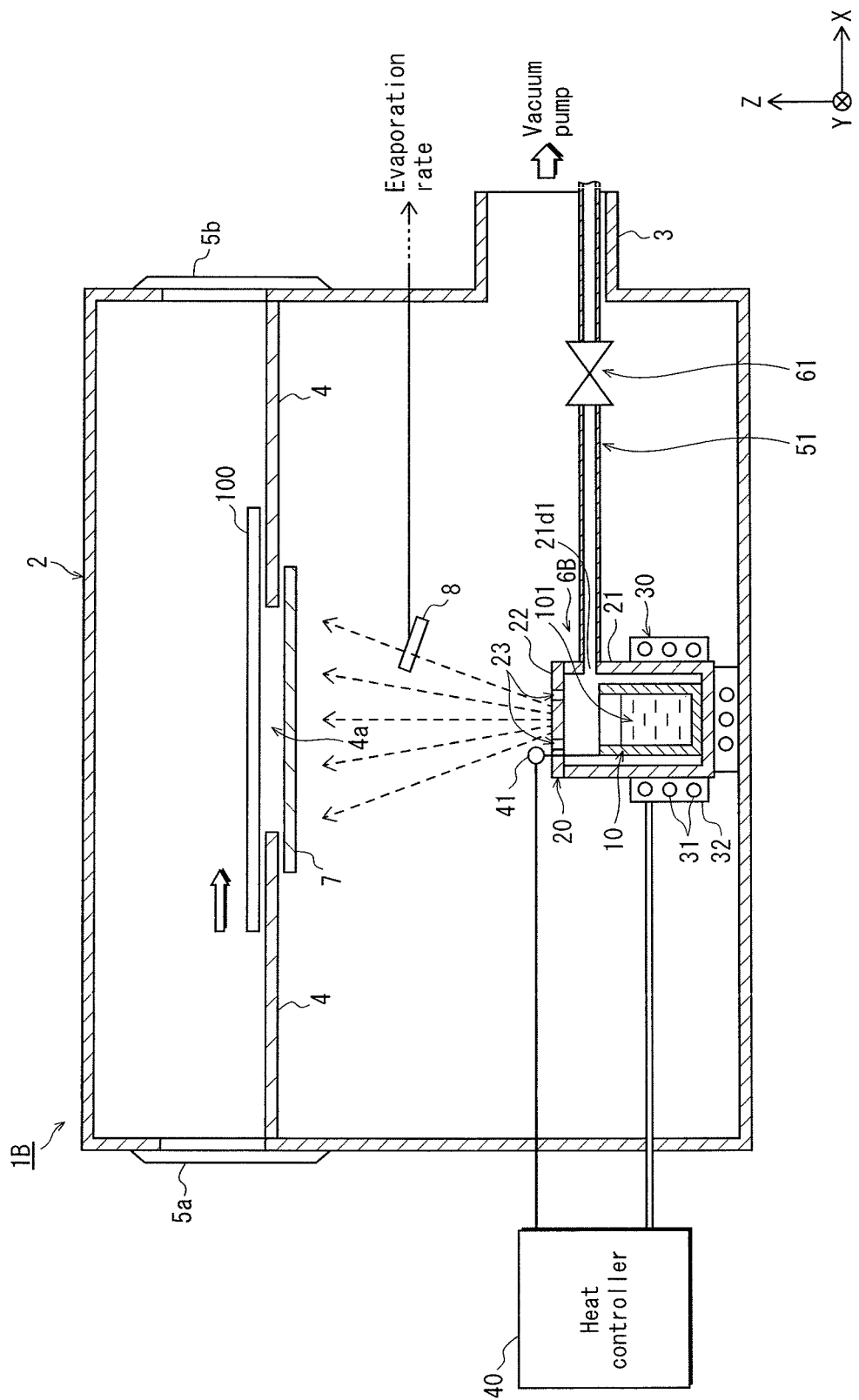
FIG. 8 is a schematic cross-sectional view illustrating the structure of a vapor deposition apparatus 1B pertaining to a modification of embodiment 3.

FIG. 8 is a schematic cross-sectional view illustrating the structure of a vapor deposition apparatus 1B pertaining to a modification of embodiment 3. The vapor deposition apparatus 1B has a structure that can be yielded by removing the air outlet means 71 from the vapor deposition apparatus 1A. Further, in the vapor deposition apparatus 1B, the air outlet tube 51 connected to the air outlet 21d1 of the vapor deposition source 6B is connected to a vacuum pump for creating a vacuum environment in the chamber 2. Other than that, the vapor deposition apparatus 1B is structurally similar to the vapor deposition apparatus 1A.

The vapor deposition apparatus 1B is operated according to the pressure profile illustrated in FIG. 5B. Further, by opening the valve 61, which is a mechanism for opening and closing the air outlet 21d1, with the vacuum pump in operation and the temperature of the vapor deposition source 6B maintained around the gas separation temperature $T_1$, gases inside the housing 20 are discharged to the outside of the chamber 2 via the air outlet tube 51 for the predetermined time period $T_A$ illustrated in FIG. 5A.

Accordingly, with the vapor deposition apparatus 1B, undesirable substances introduced into the vapor deposition material 101 are discharged to the outside of the chamber 2 as well as with the vapor deposition apparatus 1A, but with a simpler structure not including the air outlet means 71. Thus, degradation of material characteristics of the vapor deposition material is prevented from occurring during the vapor deposition process.

Note that in the description provided above, gas discharge is beneficially stopped during the vapor deposition process by closing the valve 61. This prevents the vapor deposition material from being discharged to the outside of the chamber 2 during the vapor deposition process, and consequently prevents unnecessary consumption of the vapor deposition material.

Embodiment 4

In the above, description is provided of the vapor deposition apparatus 1 pertaining to embodiment 1 and the vapor deposition method in which the vapor deposition apparatus 1 is used. However, the present invention is not only implementable as exemplified in embodiment 1. That is, the structure exemplified in embodiment 1 can be modified as follows. In the vapor deposition apparatus 1 pertaining to embodiment 1 and the vapor deposition method in which the vapor deposition apparatus 1 is used, the introduction of gas into the housing 20 and the discharge of gases inside the housing 20 to the outside of the chamber 2 are performed at the same time for a predetermined time period $T_A$, with the temperature of the vapor deposition source 6 kept around the gas separation temperature $T_1$. However, the present invention is implementable with other structures such as the structure described in the following, as long as undesirable substances having been introduced along with the vapor deposition material 101 can be discharged to the outside of the housing 20.

Figure 9:
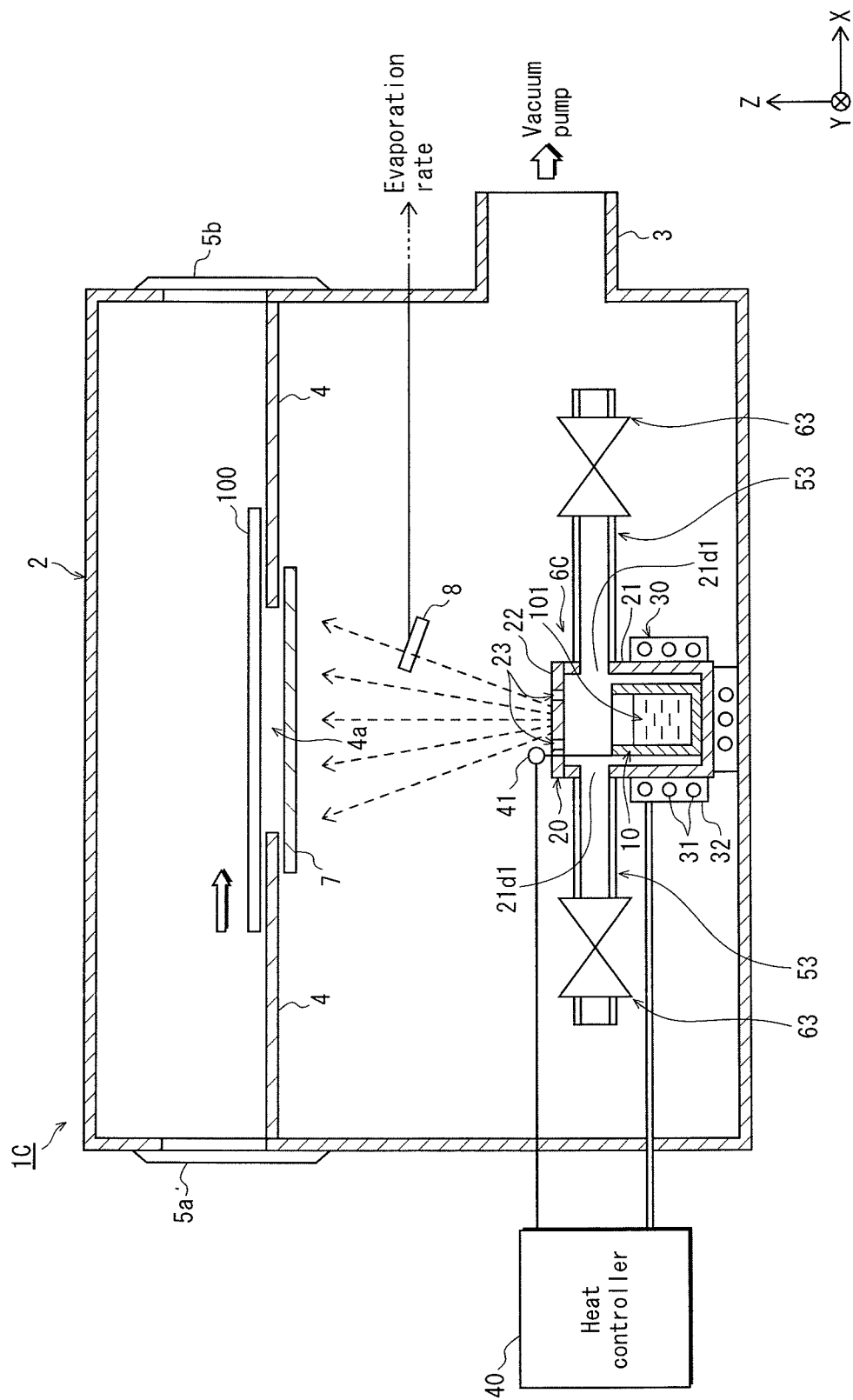
FIG. 9 is a schematic cross-sectional view illustrating the structure of a vapor deposition apparatus 1C pertaining to embodiment 4.
Figure 10:
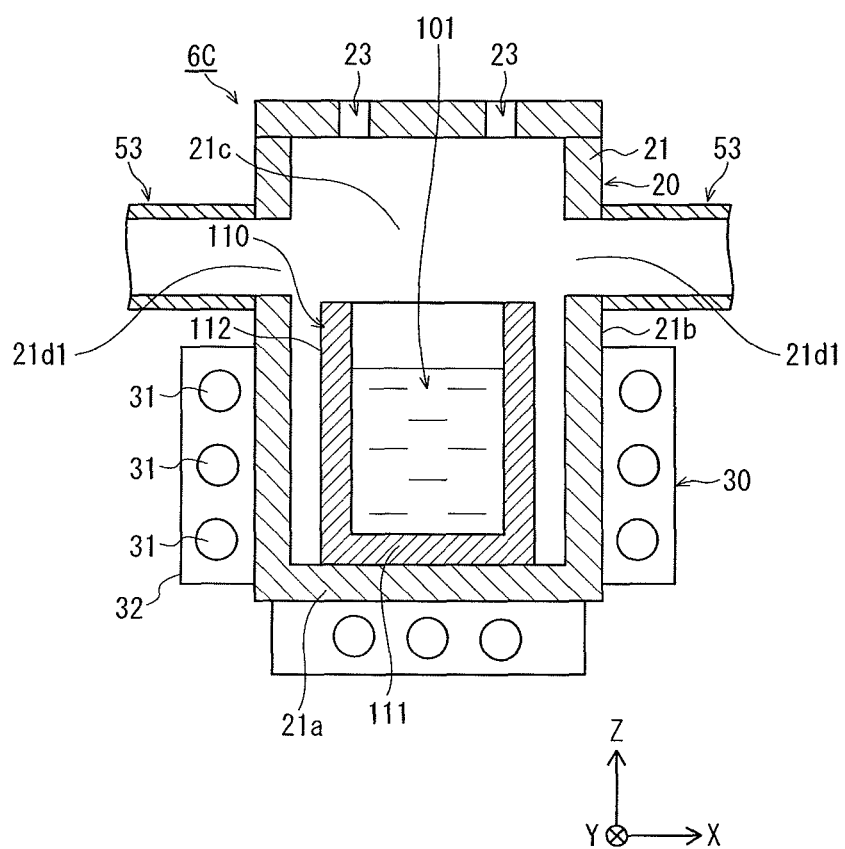
FIG. 10 is a schematic cross-sectional view illustrating a vapor deposition source 6C pertaining to embodiment 4.
Figure 11A:
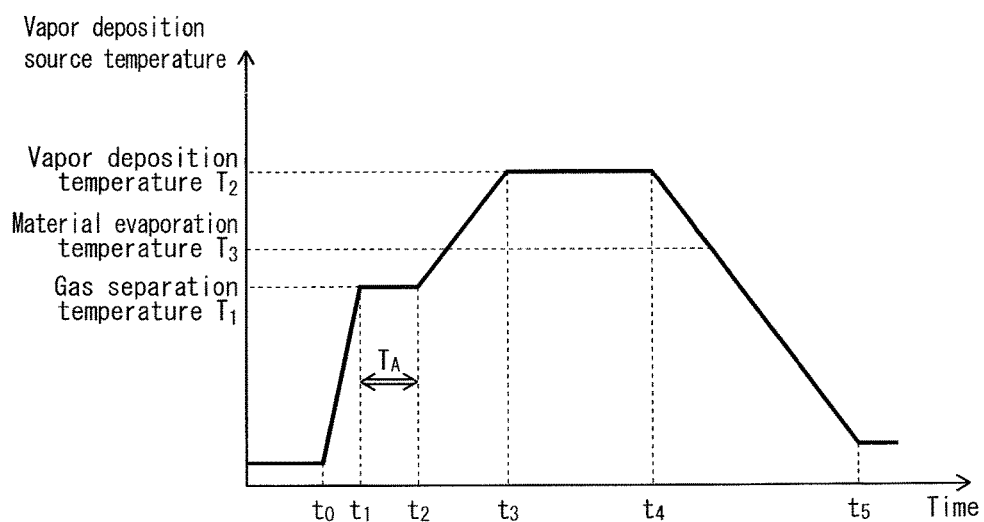
FIG. 11A illustrates one example of a temperature profile of the vapor deposition source 6C in a vapor deposition method in which the vapor deposition apparatus 1C pertaining to embodiment 4 is used.

FIG. 9 is a schematic cross-sectional view illustrating the structure of a vapor deposition apparatus 1C pertaining to embodiment 4. FIG. 10 is a schematic cross-sectional diagram of a vapor deposition source 6C. FIG. 11A illustrates one example of a temperature profile of the vapor deposition source 6C in a vapor deposition method in which the vapor deposition apparatus 1C pertaining to embodiment 4 is used, and FIG. 11B illustrates one example of a pressure profile inside the chamber 2.

As illustrated in FIG. 9, the vapor deposition apparatus 1C has a structure that can be yielded by removing the air outlet tube 51 from the vapor deposition apparatus 1B pertaining to the modification of embodiment 3, and by adding, for each of one or more air outlets 21d1 of the vapor deposition apparatus 1B, an air outlet tube 53 connected to the air outlet 21d1 and connecting the inside of the housing 20 with the inside of the chamber 2, and a valve 63 each disposed along a path of the air outlet tubes 53 and being a mechanism for opening and closing the air outlet 21d1. In the vapor deposition apparatus 1C, each air outlet 21d1 beneficially occupies a greater area than each eject outlet 23. Further, each air outlet 21d1 in the vapor deposition apparatus 1C beneficially occupies a greater area than the air outlets 21d1 in the other embodiments (i.e., the air outlets 21d1 in the vapor deposition apparatuses 1, 1A, and 1B). Other than that, the vapor deposition apparatus 1C is structurally similar to the vapor deposition apparatus 1. This structure allows gases inside the housing 20 to be discharged to the inside of the chamber 2 via the air outlet tubes 53 by opening the valves 63.

Figure 11B:
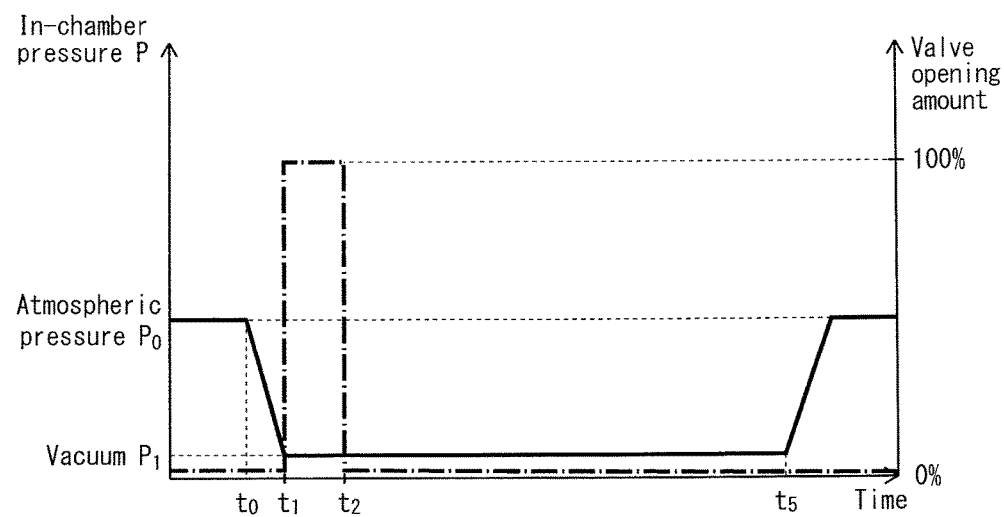
FIG. 11B illustrates one example of a pressure profile inside the chamber 2.

The vapor deposition apparatus 1C pertaining to embodiment 4 is operated according to the temperature profile illustrated in FIG. 11A and the pressure profile illustrated in FIG. 11B. Further, by opening the valves 63 with the temperature of the vapor deposition source 6C maintained around the gas separation temperature $T_1$ during the predetermined time period $T_A$ illustrated in FIG. 11A, gases inside the housing 20 are discharged to the inside of the chamber 2 via the air outlet tubes 53 for the predetermined time period $T_A$.

Accordingly, with the vapor deposition apparatus 1C, undesirable substances having entered the housing 20 along with the vapor deposition material 101 during supply of the vapor deposition material 101 are discharged to a space that is outside the housing 20 and that is inside the chamber 2. The undesirable substances, once discharged to the inside of the chamber 2, spread within the chamber 2 before being discharged to the outside of the chamber 2 by the vacuum device.

Note that gas discharge is beneficially stopped during the vapor deposition process between time points $t_3$ and $t_4$. This is since during the vapor deposition process, ejecting vapor of the vapor deposition material 101 from the eject outlets 23 towards the vapor deposition target 100 results in the vapor deposition material 101 being effectively used to deposit a film on the vapor deposition target 100.

<Effects>

As described above, in the vapor deposition process in which the vapor deposition apparatus 1C is used, the introduction of gas into the housing 20 and the discharge of gases inside the housing 20 to the space that is outside the housing 20 and that is inside the chamber 2 is performed at the same time for a predetermined time period $T_A$, with the temperature of the vapor deposition source 6C kept around the gas separation temperature $T_1$. Accordingly, undesirable substances introduced to the inside the housing 20 of the vapor deposition source 6 along with the vapor deposition material 101 during supply of the vapor deposition material 101 are discharged to the outside of the housing 20.

As already described above, a conventional vapor deposition apparatus may have the eject outlets 23 provided to the lid 22. The eject outlets 23 are provided to limit the communication between the housing 20 and the chamber 2, and to thereby increase the internal pressure of the housing 20. Further, the vapor deposition material 101, when heated, is in a relatively active state, and thus is in a state where the vapor deposition material readily reacts with undesirable substances. Thus, particularly when an organic material is used as the vapor deposition material 101, degradation of the vapor deposition material 101 is likely to occur in the conventional vapor deposition apparatus. Meanwhile, in the vapor deposition apparatus 1C, undesirable substances having entered the housing 20 can be discharged at least to the outside of the housing 20. Thus, reaction between the undesirable substances and the vapor deposition material can be prevented from occurring inside the housing 20. Accordingly, degradation of material characteristics of the vapor deposition material is prevented from occurring during the vapor deposition process.

Embodiment 5

(Organic EL Element Manufacturing Process)

FIGS. 12A through 12D illustrate processes of a device manufacturing method pertaining to embodiment 5, which is a manufacturing method of an organic EL device. FIGS. 12A through 12D illustrate a substrate 100. The substrate 100 is a combination of a TFT substrate and a planarizing film formed on the TFT substrate. The planarizing film is formed by applying a photosensitive resin on the TFT substrate, by exposing the photosensitive resin to light via a photomask, and by performing developing.

Figure 12A:
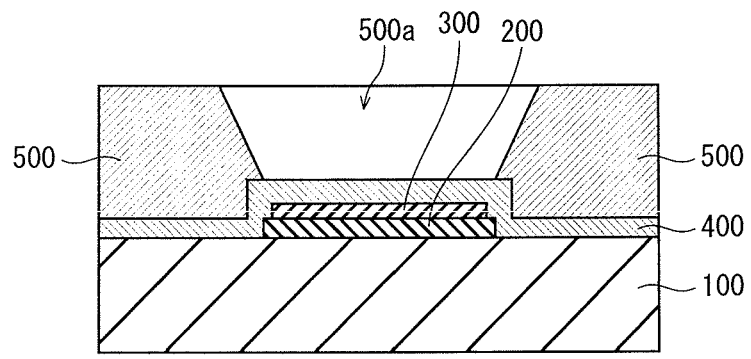
FIGS. 12A through 12D illustrate processes of a device manufacturing method pertaining to embodiment 5, which is a manufacturing method of an organic EL device.

As illustrated in FIG. 12A, an anode 200, an ITO layer 300, and a hole injection layer 400 are formed above the substrate 100 in the stated order. Further, banks 500 are formed on the hole injection layer 400. The forming of the banks 500 results in a concave space 500a being formed between the banks 500. The concave space 500a is a space where an element is to be formed.

The anode 200 is formed by forming a thin film of Ag through sputtering for example, and then patterning the thin film of Ag into a matrix through photolithography for example. Note that the thin film of Ag may be formed, for example, through vacuum vapor deposition according to the above-described vapor deposition method.

The ITO layer 300 is formed by forming a thin film of ITO through sputtering for example, and then patterning the thin film of ITO through photolithography for example.

The hole injection layer 400 may be formed by using a composition containing $WO_x$ or $Mo_xW_yO_z$, and by performing vacuum vapor deposition according to the above-described vapor deposition method or sputtering, for example.

The banks 500 are formed by forming a layer of bank material by applying the bank material onto the hole injection layer 400, and by removing part of the layer of bank material. The removal of the layer of bank material may be performed by forming a resist pattern on the layer of bank material and then performing etching. Here, note that treatment for providing the surface(s) of the layer of bank material with liquid repellency may be performed when necessary. Such treatment may be plasma treatment in which a fluorine material is used. Here, the banks 500 form a line bank structure, and thus, a plurality of linear banks are formed parallel to one another above the substrate 100.

Figure 12B:
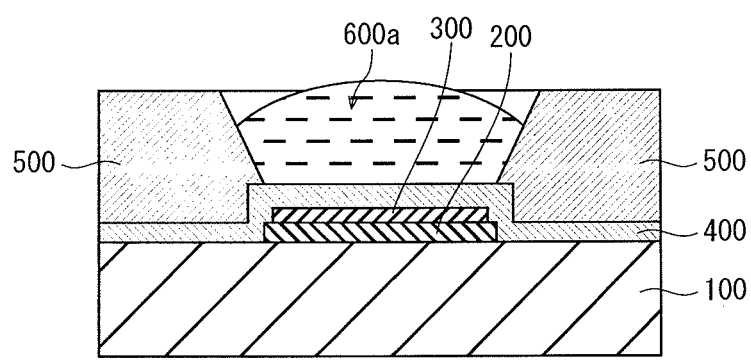

Subsequently, a light-emitting layer 600 is formed. The light-emitting layer 600 is a functional layer. Specifically, the light-emitting layer 600 is formed as illustrated in FIG. 12B, by filling the concave space 500a between the banks 500, which is the area at which one sub-pixel is to be formed, with ink containing an organic light-emitting layer material through inkjet printing, drying the film formed through the printing, and then performing baking.

Figure 12C:
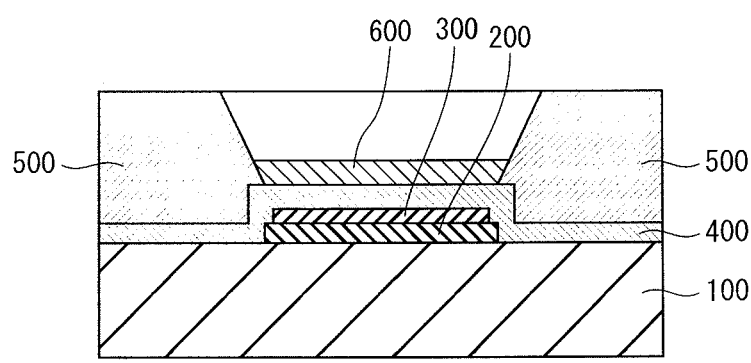

FIG. 12C illustrates only one light-emitting layer 600 disposed between one pair of banks 500. However, above the substrate 1, sets of light-emitting layers each composed of a red light-emitting layer, a green light-emitting layer, and a blue light-emitting layer are repeatedly disposed along the lateral direction in FIGS. 12A through 12D. Each light-emitting layer 600 is formed as illustrated in FIG. 12C. Specifically, the concave space 500a is filled with an ink 600a, and the ink 600a is dried under reduced pressure. The ink 600a contains organic light-emitting material corresponding to one of the colors red, green, and blue.

Further, while not illustrated in any of FIGS. 12A through 12D, a hole transport layer may be formed below the light-emitting layer 600 through a wet process. The hole transport layer is also a functional layer. In addition, an electron transport layer may be formed above the light-emitting layer 600 through a wet process. The electron transport layer is also a functional layer.

Figure 12D:
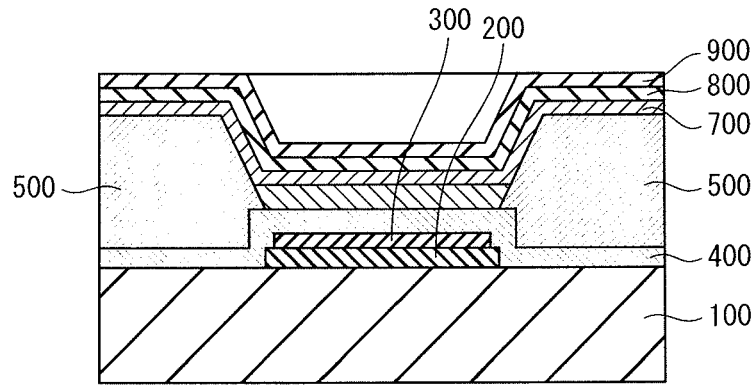

Subsequently, an electron injection layer 700, a cathode 800, and a sealing layer 900 are formed in the stated order as illustrated in FIG. 12D.

The electron injection layer 700 may be formed by using an organic material doped with an alkali metal or an alkali earth material for example, and by forming a thin film of such an organic material through vacuum vapor deposition according to the above-described vapor deposition method.

The cathode 800 is formed, for example, by forming a thin film of ITO through sputtering.

The sealing layer 900 is formed by applying a resin sealing material and hardening the resin sealing material through UV irradiation. Additionally, a glass plate may be disposed on the sealing layer 900 for further sealing.

Each organic EL device is manufactured through the above-described processes, and as such a device is manufactured.

Note that forming organic functional layers such as the hole injection layer 400 and the electron injection layer 700 according to the vapor deposition methods described in embodiments 1 through 4 achieves discharging undesirable substances introduced inside the housing 20 of the vapor deposition source 6 along with the vapor deposition material 101 to be discharged to the outside of the housing 20. Accordingly, reaction between the undesirable substances and the vapor deposition material is prevented. Thus, degradation of material characteristics of the vapor deposition material is prevented from occurring during the vapor deposition process. In addition, organic functional layers formed through the vapor deposition contain a small amount of undesirable substances. Further, the vapor deposition methods described in embodiments 1 through 4 are applicable to a metal layer such as a thin film of Ag.

CONCLUSION

As described up to this point, the vapor deposition apparatuses pertaining to the embodiments each have a structure where the vapor deposition apparatus includes: a chamber 2 that holds an object (vapor deposition target) 100 on which a film is to be deposited through vapor deposition; a vapor deposition source 6 that is disposed inside the chamber 2, the vapor deposition source 6 having a housing 20 that accommodates therein a vapor deposition material 101 for the vapor deposition; and a heater 30 that heats the vapor deposition material 101, wherein the housing 20 has a plurality of eject outlets 23 and an air outlet 21d1 for which a mechanism for opening and closing is provided, the plurality of eject outlets 23 connecting the inside of the housing 20 with the outside of the housing 20 and ejecting vapor of the vapor deposition material 101 towards the object 100.

Thus, undesirable substances introduced inside the housing 20 of the vapor deposition source 6 along with the vapor deposition material 101 are discharged to the outside of the housing 20. Thus, reaction between the undesirable substances and the vapor deposition material can be prevented. Thus, degradation of material characteristics of the vapor deposition material is prevented from occurring during the vapor deposition process.

<<Modifications>>

1. In the embodiments, only one vapor deposition source 6 is disposed inside the chamber 2. However, two or more vapor deposition sources may be disposed inside the chamber, and when making such a modification, degradation of material characteristics of the vapor deposition material may be prevented by applying the structure described in the embodiments to each vapor deposition source.

2. In the embodiments, the housing 20 of the vapor deposition source 6 is disposed on a bottom plate of the chamber 2, as illustrated in FIG. 1. However, the housing 20 and the chamber 2 may be formed integrally.

3. In the embodiments, description is provided of a case where the vapor deposition source is a so-called line source and has an elongated shape. However, the vapor deposition source need not be a line source, and similar implementation is possible with, for example, a cylindrical vapor deposition source. That is, as long as the vapor deposition source has a housing defining a concave space in which a crucible can be accommodated and a lid covering an opening of the concave space and having a plurality of eject outlets disposed therein, the effect of preventing undesirable adhesion of the crucible to the housing may be similarly achieved by, for example, providing a plurality of support protrusions to the bottom surface, the brim, or the like of the crucible, and/or to the housing, regardless of the shape of the vapor deposition source.

4. In embodiment 5, the light-emitting layer 600 is formed through applying ink with respect to the substrate by using an ink droplet ejection device having a single inkjet head. However, the light-emitting layer 600 may be formed, for example, through vapor deposition. When forming the light-emitting layer 600 through vapor deposition, the vapor deposition methods described in embodiments 1 through 4 may be applied. By applying this method, the inclusion of undesirable substances in organic functional layers, including the light-emitting layer 600, can be prevented.

5. The above-described order in which processes are carried out is a mere example used for providing specific description of the present invention. Accordingly, the processes may be carried out in an order differing from that described above. Further, some of the processes may be carried out simultaneously (in parallel). In addition, at least some of the device manufacturing methods and the functions of modifications thereof, which are described in the embodiments, may be combined with one another. Further, the present invention shall be construed as including various modifications that skilled artisans may arrive at based on the embodiments.

<<Supplement>>

The embodiments described above are mere preferable examples of how the present invention may be specifically implemented. As such, values, shapes, materials, components, arrangement positions of components, connections between components, processes, and the order in which processes are carried out described above are mere examples, and shall not be construed as limiting the present invention. Further, among the components described in the embodiments, those that are not recited in the independent claims, which describe the present invention using the broadest of concepts, shall be construed as being components that may be and may not be included in preferable forms of implementation of the present invention.

In addition, the drawings referred to in the embodiments may illustrate components at sizes differing from their actual sizes, in order to facilitate understanding of the invention. Further, the present invention shall not be construed as being limited to what is disclosed in the embodiments, and instead, shall be construed as including various modifications that do not depart from the spirit and scope thereof.

Further, a vapor deposition apparatus typically includes members such as circuit components and lead wires disposed on and above a substrate. However, the description provided up to this point does not include description of such electrical wiring and electrical circuits for not being directly necessary in describing the present invention, and electrical wiring and electrical circuits may be implemented in various forms based on common knowledge in the technical field. In addition, the drawings referred to in the above are schematics, and as such, do not necessarily provide precise illustration.

INDUSTRIAL APPLICABILITY

The present invention is widely applicable in general to the manufacturing of devices that may be manufactured by using a vapor deposition apparatus and through vapor deposition, such as organic light-emitting elements and TFT substrates.

REFERENCE SIGNS LIST

1, 1X, 1A, 1B, 1C vapor deposition apparatus
2 chamber
3 chamber air outlet
4 partition plate
4*a* window
5*a* entrance
5*b* exit
6, 6X, 6A, 6B, 6C vapor deposition source
7 shutter
10 crucible
20 housing
21 main body
21*a* bottom plate
21*b* circumferential wall
22 lid
23 eject outlet
30 heater
51, 53 air outlet tube
52 air inlet tube
61, 62, 63 valve (mechanism for opening and closing)
71 air outlet means
72 air inlet means
100 substrate (vapor deposition target)
101 vapor deposition material

What is claimed is:

1. A vapor deposition apparatus comprising:
a chamber that holds an object on which a film is to be deposited through vapor deposition;
a vapor deposition source that is disposed inside the chamber,
the vapor deposition source including:
a housing that accommodates therein a vapor deposition material for the vapor deposition; and a crucible disposed inside the housing that accommodates the vapor deposition material; and a heater that heats the vapor deposition material, wherein the housing includes:

a plurality of eject outlets that connect the inside of the housing with the outside of the housing and ejecting vapor of the vapor deposition material towards the object;

an air outlet that is openable and closable, a main body portion composed of a bottom plate and a circumferential wall around the bottom plate, and a lid portion that is disposed facing the bottom plate, the lid portion, the bottom plate, and the circumferential wall together defining a space inside the housing in which the crucible is accommodated, wherein the plurality of eject outlets are disposed in the lid portion, and the air outlet is provided in the circumferential wall between a top edge of the crucible and the plurality of eject outlets.

2. The vapor deposition apparatus of claim 1 further comprising:

an air outlet tube that is connected to the air outlet and connects the inside of the housing with the outside of the chamber; and an air outlet unit that causes gas inside the housing to exit the housing to the outside of the chamber via the air outlet tube.

3. The vapor deposition apparatus of claim 1, wherein the housing has an air inlet, and the vapor deposition apparatus further comprises:

an air inlet tube that is connected to the air inlet and connects the inside of the housing with the outside of the chamber; and an air inlet unit that allows gas to enter the housing via the air inlet tube.

4. The vapor deposition apparatus of claim 1, wherein the air outlet connects the inside of the housing with a space that is outside the housing and that is inside the chamber.

5. The vapor deposition apparatus of claim 1, further comprising a valve that opens and closes the air outlet.

6. A vapor deposition source that is used in a vapor deposition apparatus for forming an organic layer onto an object through vapor deposition, the vapor deposition source comprising:

a housing accommodating therein a vapor deposition material for the vapor deposition; and a crucible disposed inside the housing that accommodates the vapor deposition material, wherein the housing including:

a plurality of eject outlets that connect the inside of the housing with the outside of the housing and ejecting vapor of the vapor deposition material towards the object;

an air outlet that is openable and closable, a main body portion composed of a bottom plate and a circumferential wall around the bottom plate, and a lid portion that is disposed facing the bottom plate, the lid portion, the bottom plate, and the circumferential wall together defining a space inside the housing in which the crucible is accommodated, wherein the plurality of eject outlets are disposed in the lid portion, and the air outlet is provided in the circumferential wall between a top edge of the crucible and the plurality of eject outlets.

\* \* \* \* \*